(12) United States Patent
Mirabel et al.

(10) Patent No.: US 6,829,170 B2
(45) Date of Patent: Dec. 7, 2004

(54) METHOD OF CONTROLLING AN ELECTRONIC NON-VOLATILE MEMORY AND ASSOCIATED DEVICE

(75) Inventors: Jean-Michel Mirabel, Cabries (FR); Rachid Bouchakour, Marseilles (FR); Pierre Canet, Les Milles (FR); Romain Laffont, Marseilles (FR); Juliano Razafindramora, Marseilles (FR)

(73) Assignees: STMicroelectronics SA, Montrouge (FR); Laboratoire Matériaux et Microélectronique de Provence, Marseille Cedex (FR)

( * ) Notice: Subject to any disclaimer, the term of this patent is extended or adjusted under 35 U.S.C. 154(b) by 0 days.

(21) Appl. No.: 10/616,413

(22) Filed: Jul. 9, 2003

(65) Prior Publication Data

US 2004/0057265 A1 Mar. 25, 2004

(30) Foreign Application Priority Data

Jul. 11, 2002 (FR) .......................................... 02 08755

(51) Int. Cl.[7] .............................................. G11C 16/04
(52) U.S. Cl. ............................. 365/185.18; 365/185.19
(58) Field of Search ...................... 365/185.01, 185.18, 365/185.19

(56) References Cited

U.S. PATENT DOCUMENTS

| | | | |
|---|---|---|---|
| 4,628,487 A | * 12/1986 | Smayling | ............... 365/185.22 |
| 5,726,933 A | 3/1998 | Lee et al. | .............. 365/185.18 |
| 5,781,477 A | 7/1998 | Rinerson et al. | ....... 365/185.29 |
| 5,790,460 A | 8/1998 | Chen et al. | ............ 365/185.29 |
| 5,933,367 A | 8/1999 | Matsuo et al. | ......... 365/185.29 |
| 5,986,936 A | * 11/1999 | Ravazzini | .............. 365/185.19 |
| 6,055,183 A | * 4/2000 | Ho et al. | ............... 365/185.09 |
| 6,236,596 B1 | 5/2001 | Sobek et al. | ........... 365/185.27 |
| 6,392,931 B1 | * 5/2002 | Pasotti et al. | .......... 365/185.19 |
| 6,650,153 B2 | * 11/2003 | Zerilli et al. | ................. 327/134 |

OTHER PUBLICATIONS

Laffont et al., *Decreasing EEPROM Programming Bias with Negative Voltage Reliability Impact*, IEEE International Workshop on Memory Technology, Design and Testing (MTDT 2002), Jul. 10, 2002, pp. 168–173, XP010601068.
Benzerti et al., *Effect of the Selection MOS Transistor Polarization Voltage During a Write and an Erase Operation of an EEPROM Memory Cell*, Microelectronics, 1998, ICM 98, Proceedings of the Tenth International Conference on Monastir, Tunisia, Dec. 14–16, 1998, Piscataway, NJ, US, Dec. 14, 1998, pp. 149–152, XP010371938.

* cited by examiner

*Primary Examiner*—Van Thu Nguyen
(74) *Attorney, Agent, or Firm*—Lisa K. Jorgenson; Allen, Dyer, Doppelt, Milbrath & Gilchrist, P.A.

(57) ABSTRACT

A memory cell in an EEPROM includes a floating gate transistor that includes a first conducting terminal and a control gate. A method of controlling the memory cell includes setting a state of the memory cell by simultaneously applying voltage pulses of opposite polarities respectively to the first conducting terminal and to the control gate. The voltage pulses including a first portion having a first slope and a second portion having a second slope, wherein the second slope is based upon the polarities of the voltage pulses. The method allows the amplitude of the voltage pulses to be reduced.

35 Claims, 3 Drawing Sheets

METHOD OF CONTROLLING AN ELECTRONIC NON-VOLATILE MEMORY AND ASSOCIATED DEVICE

FIELD OF THE INVENTION

The present invention relates to non-volatile electronic memories, and in particular, to a method of controlling memory cells in an EEPROM that includes setting a state of the memory cells.

BACKGROUND OF THE INVENTION

EPROM devices that include floating gate transistors are electrically programmable but are not electrically erasable. These memory devices are erasable only by ultraviolet rays. EPROMs are programmed using a thermal agitation phenomenon in the conduction channel under the effect of a saturation current, which is irreversible.

EEPROMs are electrically programmable and erasable. EEPROMs are programmed or erased by the tunnel effect. The programming and erasing voltages are usually produced by internal circuits of the memory, such as charge pumps or multipliers.

The paper presented by Canet, Bouchakour, Harabech, Boivin, Mirabel and Plossu at the $43^{rd}$ IEEE symposium on circuits and systems in Lansing, Mich. on Aug. 8–11, 2000 describes an EEPROM cell using a control signal that reduces the electric field of the tunnel oxide during cell programming and erasing.

The paper presented by Canet, Bouchakour, Harabech, Boivin and Mirabel at the ISCAS-IEEE international symposium on circuits and systems in Sydney, Australia describes a control signal enabling a reduction in the programming time. FIGS. 2 and 3 illustrate schematically a memory cell and the voltages applied to its electrodes, respectively during an erasing step and during a programming step. During erasing, the substrate, drain and source are connected to ground, and a positive voltage pulse is applied to the control gate of the memory cell.

The ratio between the floating gate voltage and the control gate voltage is in this case defined by the following formula: Kc=Cpp/(Cpp+Ctun+Cox). Cpp is the coupling capacitance between the control gate and the floating gate, Ctun is the capacitance between the drain and the floating gate, and Cox is the capacitance between the floating gate and the substrate. The tunnel voltage is then defined by Vtun=Kc*Vg, where Vg is the voltage applied to the gate.

During programming, the control gate and the substrate are connected to ground, the source is floating, and a positive voltage pulse is applied to the drain. The ratio between the floating gate voltage and the control gate voltage is in this case defined by the following formula: Kw=Ctun/(Cpp+Ctun+Cox). The tunnel voltage is then defined by Vtun=(1-Kw)*Vd, where Vd is the drain voltage.

These EEPROMs and their control method have drawbacks. To maintain a same injected charge and similar performance, an optimized control signal implies an increase in the drain or gate biasing voltage. It is difficult to devise a power supply for the memory array which generates a sufficiently high biasing voltage. Moreover, this memory cell is subjected to a tunnel effect phenomenon between conduction bands, known under the acronym BTBT, which is the source of an increase in the cell's consumption. Moreover, the optimized programming and erasing pulses are difficult to generate and complicate the associated power supply.

SUMMARY OF THE INVENTION

In view of the foregoing background, an object of the present invention is to provide an EEPROM memory control method and a corresponding EEPROM that overcomes the above described drawbacks.

The method of the invention, which is also in conformance with the generic definition given in the background section, is essentially characterized in that the state setting step comprises a simultaneous application of opposite polarity voltage pulses respectively to the drain and to the control gate of the floating gate transistor. The pulses may exhibit a first portion exhibiting an edge/slope greater than K*8 MV/s, and a second portion exhibiting an edge/slope between K*1 KV/s and K*1 MV/s, with K=1 when the pulse has a positive polarity and with K=−1 when the pulse has a negative polarity. The pulses may further have a third portion exhibiting a substantially zero slope, and a fourth portion exhibiting an edge/slope of less than K*16 MV/s.

At least one state setting step may be a programming step in which the voltage applied to the control gate is negative, and the voltage applied to the drain is positive. At least one state setting step may be an erasing step in which the voltage applied to the control gate is positive, and the voltage applied to the drain is negative. The voltages applied simultaneously to the control gate and to the drain may have a same amplitude.

In one embodiment, the transistor is formed in a substrate, and the method further comprises applying the drain voltage to the substrate, at least during the state setting step of the cell. The polarities of the applied voltages may be defined relative to a reference voltage, and the substrate may have a ground whose voltage is the reference voltage. The amplitudes of the applied voltages may be less than 10 volts. The potential difference between the control gate and the drain is between 12 and 16 volts during the simultaneous application of the voltages.

The cell may additionally include a selection transistor whose source is connected to the drain of the floating gate transistor, and a voltage of less than 12 volts may be applied to the gate of the selection transistor during the programming or erasing step of the cell. The voltage applied to the drain of the selection transistor may exhibit the same polarity as the voltage applied to the drain of floating gate transistor during the state setting step.

The invention also relates to an electronic device comprising at least one EEPROM memory cell and a power supply for the cell for implementing the above-described method. The electronic device may be produced on a P-type substrate. The cell may include a floating gate transistor produced on the surface of a P-type well. The electronic device may also have an N-type isolation well separating the P-type well from the P-type substrate.

BRIEF DESCRIPTION OF THE DRAWINGS

The invention shall be better understood upon reading the following description and studying the appended drawings. The figures show.

DETAILED DESCRIPTION OF THE PREFERRED EMBODIMENTS

The voltage values indicated below correspond to peak voltages. The invention simultaneously applies voltages of opposite polarities respectively to the drain and to the control gate of the floating gate transistor of an EEPROM memory cell during the state setting step—which is either an erasing step or a programming step. The applied voltages are pulses having an optimized shape, as will be defined in greater detail below. It is thus possible to split the biasing voltage between the control gate and the drain during the state setting step. Moreover, the generation of optimized pulses is facilitated with the disclosed electronic device in accordance with the present invention.

Figure 1:
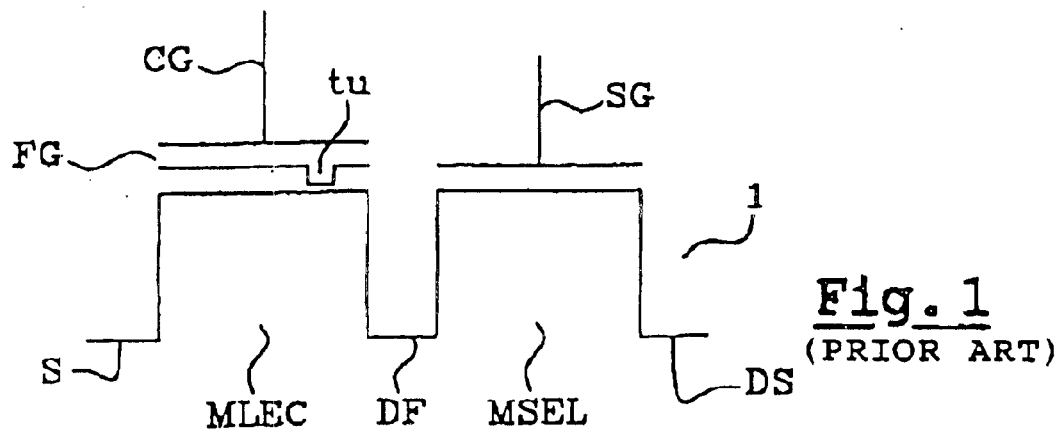
FIG. 1 is a schematic diagram of a memory cell structure in accordance with the prior art.
Figure 2:
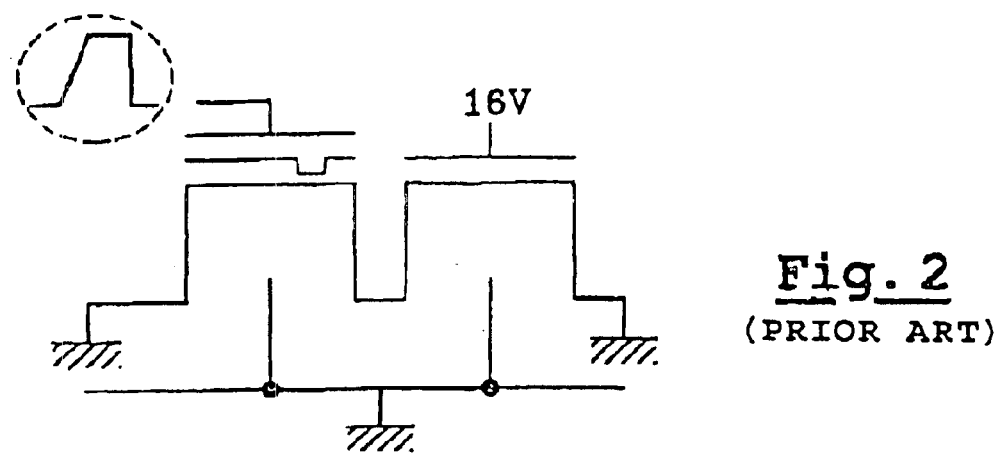
FIG. 2 is a schematic diagram showing the erasing voltages applied to a memory cell in accordance with the prior art.
Figure 3:
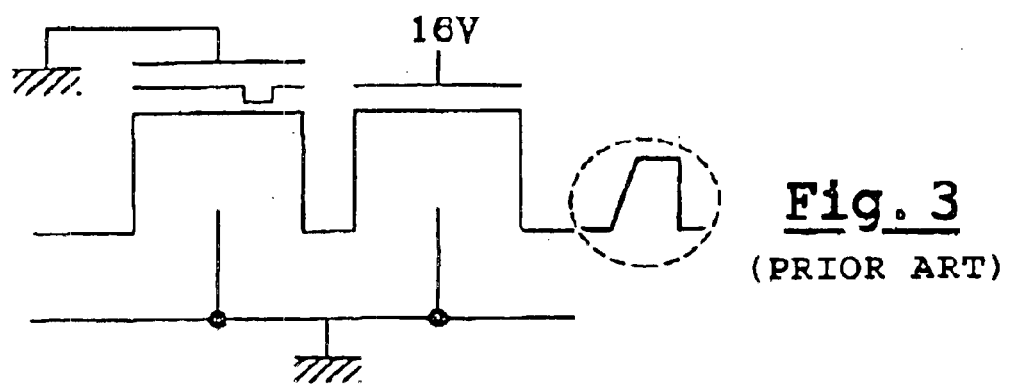
FIG. 3 is a schematic diagram showing the programming voltages applied to a memory in accordance with the prior art.

FIG. 1 shows an example of a cell structure of an EEPROM 1. The memory cell has a selection transistor Msel and a floating gate type storage transistor Mlec. Transistor Msel selectively connects the drain DF of transistor Mlec to a bit line (not shown). Transistor Mlec has two stacked gates: a floating lower gate FG and a control upper gate CG. These two gates are separated by an interpolysilicon oxide.

Transistor Mlec has a tunnel window tu with a thickness on the order of 80 nm between the floating gate FG and the drain DF. The window tu allows a tunnel current to pass between the drain and floating gate of transistor Mlec when the voltage between the faces of the tunnel oxide exceeds a critical threshold. This voltage corresponds to an electric field on the order of $10*10^6$ V/m. Depending on whether the voltage is positive or negative the floating gate becomes positively or negatively charged. The stacking of gates CG and FG forms a capacitor at the terminals of which there then appears a permanent potential difference.

The conduction of transistor Mlec depends on the charge in the floating gate. When transistors Msel and Mlec are conducting, the current between the source S of transistor Mlec and the drain DS of transistor Msel depends on the programming state of the cell determined by the charge. A reference readout voltage is applied to the gate CG, then the current is measured and compared with a reference value. The comparison yields binary information on the cell's programming state. The reference current corresponds to the current obtained for a threshold voltage devoid of charge for the EEPROM cell. This voltage corresponds to the case where the floating gate is discharged.

Figure 4:
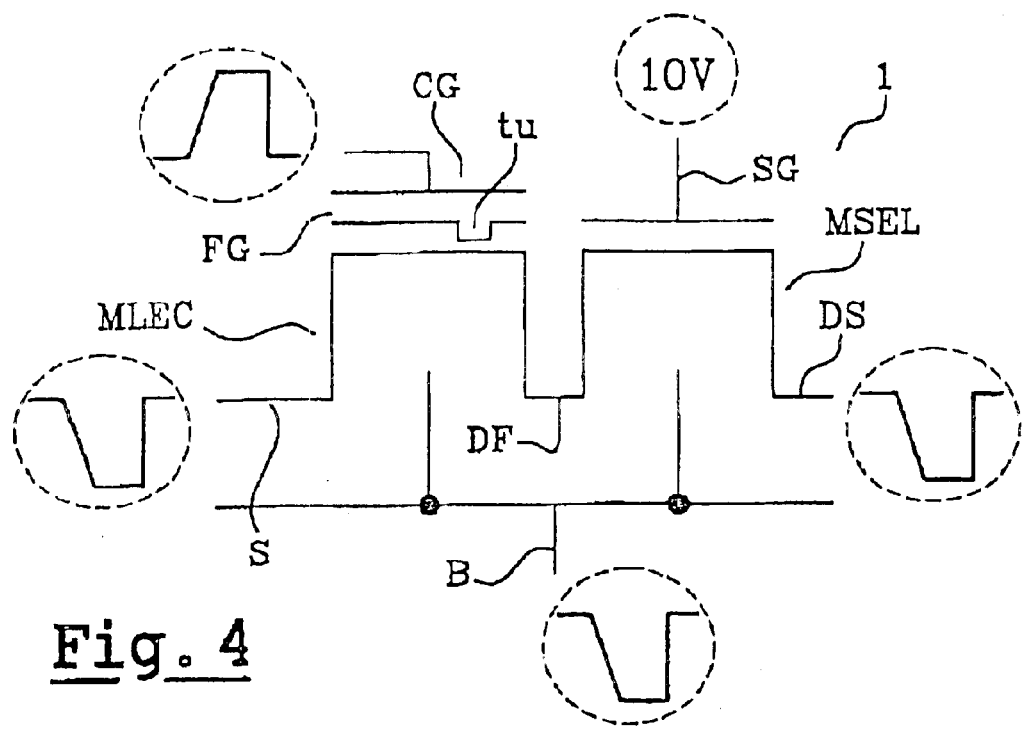
FIG. 4 is a schematic diagram showing the erasing voltages applied to a memory cell in accordance with the present invention.
Figure 5:
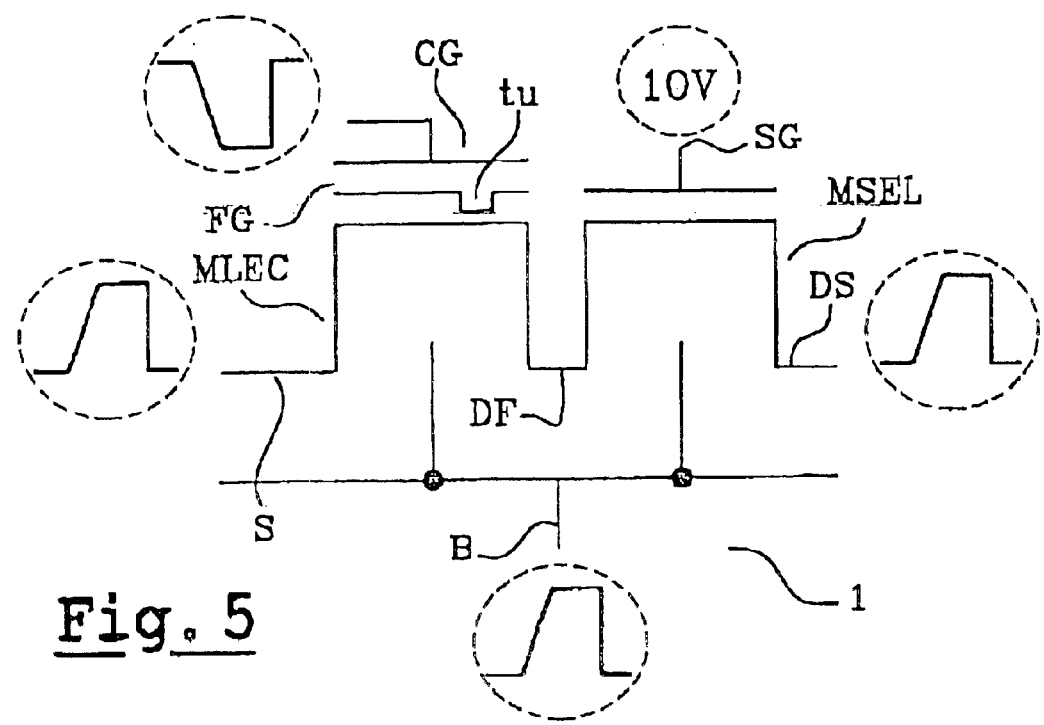
FIG. 5 is a schematic diagram showing the programming voltages applied to a memory cell in accordance with the present invention.

FIGS. 4 and 5 show an EEPROM memory cell comprising a selection transistor Msel, a floating gate storage and readout transistor Mlec, and a substrate B. The floating gate transistor Mlec has a control gate CG, a floating gate FG, a source S and a drain DF. Transistor Msel has a selection gate SG, a drain DS and a source DF connected to the drain of transistor Mlec.

The diagrams framed by broken lines correspond to voltages applied to cell electrodes. The erasing and programming steps are the cell's state setting steps. During a state setting step, voltages of opposite polarity are simultaneously applied to the drain and to the control gate of the transistor.

Accordingly, for a predetermined potential difference applied between the control gate CG and the drain DF, there is a reduction in the amplitude of the voltages applied respectively to the control gate CG and to the drain DF. This sharing of the voltages applied to the electrodes during a state setting step allows a power supply for the cells which is less costly and has a lower electrical consumption. It is notably possible to use charge pumps having a lower power at the cell output.

Sharing of the voltages also provides an attenuation or elimination of the tunnel effect by conduction band curvature—also known as BTBT for band-to-band tunneling. Sharing of the voltages further allows the voltage applied to the selection gate of the selection transistor Msel to be reduced if needed. A voltage of less than 12 Volts may be applied to the gate of the selection transistor during the state setting steps.

As can be observed from FIGS. 4 and 5, a power supply applies a voltage of a given polarity to the drain DS of transistor Msel. The selection gate SG receiving a voltage causing transistor Msel to conduct during a state setting step includes applying the same polarity voltage to the drain DS and to the drain DF of transistor Mlec.

FIG. 4 shows a memory cell 1 and the voltages applied to its electrodes during an erasing step. The voltage applied to the control gate CG then passes from a reference voltage to a positive voltage. The voltage applied to the drain DS, and hence also the voltage applied to the drain DF, passes from a reference voltage to a negative-voltage. A positive voltage is thus simultaneously applied to the control gate CG and a negative voltage to the drain DF.

FIG. 5 shows a memory cell 1 and the voltages applied to the electrodes during a programming step. The voltage applied to the control gate CG thereby passes from a reference voltage to a negative voltage. The voltage applied to drain DS, and hence the voltage applied to drain DF, passes from a reference voltage to a positive voltage. There is thus simultaneously applied a negative voltage to the control gate CG and a positive voltage to drain DF.

Figure 6:
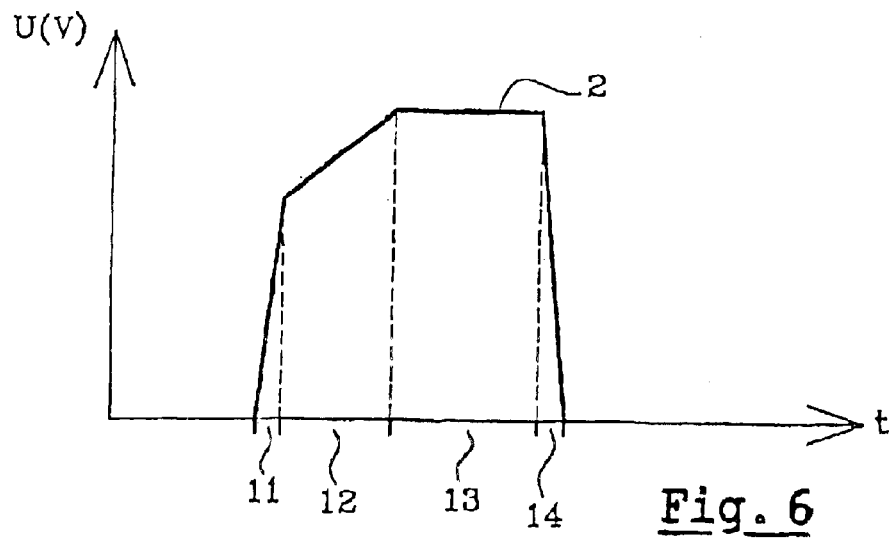
FIG. 6 is a graph of an optimized voltage pulse applied to a memory cell electrode during a state setting step.

The voltages applied to the drain, source, and control gate or to the substrate during a state setting step are pulses, and have a timing diagram as shown in FIG. 6. In the formula that follows, K is a coefficient defined by K=1 when the pulse has a positive polarity, and K=−1 when the pulse has a negative polarity. The pulse 2 has a first portion 11 having a slope greater than K*8 MV/s. This slope enables the tunnel effect to be quickly established in the floating gate transistor. A state setting step can thus be accelerated. A second portion 12 continues from the first portion and has a slope between K*1 KV/s and K*1 MV/s. The second portion serves to set the tunnel current. The slope in this range is chosen to be substantially proportional to the desired speed of the cell. When the slope of the second portion is kept to that range, the reliability of the memory cell is improved. The transition from the first portion to the second portion is preferably made just before the flow of tunnel current.

A third portion 13 continues from the second portion and has a substantially zero slope. This third portion enables compensation for variations in the pulse during cell operation. This portion effectively ensures that the first and second portions have been executed in their entirety. A fourth portion 14 continues from the third portion and has a slope less than K*16 MV/s. Such a slope is used preferably to reduce the cell's writing or erasing time.

Such pulses are more easily generated when opposite polarity pulses are simultaneously applied respectively to the drain and control gate of the floating gate transistor during a state setting step. Indeed, since the amplitudes of the voltages applied to these electrodes are more reduced, constraints on the power supply to generate such slopes are reduced. Accordingly, for given slopes of part 1 or 4 of the pulse, a simplified and less costly power structure can be used.

The potential differences between the control gate CG and drain DF or DS are preferably equal during a programming step and during an erasing step. Generally, the voltages used allow for the electric field in the tunnel oxide to be identical, in absolute value, during the programming and erasing steps. The voltages on the control gate CG and on drain DF are then adapted as a function of the coupling coefficients respectively in programming and in erasure. It is thus possible to charge the floating gate identically, in terms of absolute value, during a programming step and during an erasing step. The incidence of a loss of charge shall then be identical for the two state setting steps. Moreover, if equal amplitudes are used on the control gate CG and on drain DF, the erasing and programming voltages are centered relative to a readout voltage.

It is also possible to have a state setting step during which the voltages simultaneously applied to the control gate and to drain DF have a same amplitude. This alternative also allows simplification of the power supply. A same voltage source, whose polarity is modified, can then be used to supply the gate CG and drain DF. This alternative also allows voltages of minimal amplitude to be used on the control gate and on the drain DF. Indeed, the amplitude of the voltages applied to the gate CG and to the drain DF is then one half of a predetermined potential difference applied between the control gate CG and the drain DF.

A zero potential difference is also preferably applied between the drain DF or drain DS and the substrate B during a state setting step of the cell. The voltage of the substrate B can notably be the voltage of an N-type isolation well of the substrate. Accordingly, in the case where the drain DS is N-doped and where the isolation well is N-doped, the current consumption on the drain is reduced. Also, during a programming step, a positive voltage is applied to the N-type isolation well of the substrate. This thereby eliminates the substrate effect of the selection transistor Msel, which allows an optimal use of the output level of a cell power supply pump. Using the definitions given above for Kc and Kw, the equations in this case become as follows: Kc=Cpp/(Cpp+Ctun+Cox); and Kw=(Ctun+Cox)/(Cox+Ctun+Cpp) since the potential difference between drain DS and the control gate CG is zero. The relation Kc+Kw=1 is thus verified for the cell's state setting steps.

The tunnel potential difference Vtun, applied between the drain DS and the control gate CG, thus verifies the relation Vtun=Kc*Vg−(1−Kw)*Vd, then the relation Vtun=Kc*(Vg−Vd). Vg is the voltage of the control gate and Vd is the voltage of drain DS. The latter relation enables the voltages Vd and Vg to be determined to apply during a state setting step for a predetermined potential difference Vtun.

In the example presented, the source S and the drain DF are substantially at the same voltage during the erasing and programming steps. It is also possible to leave the source S floating during the erasing and programming steps. This alternative allows a reduction or elimination of perturbations on other memory cells not selected during the state setting steps of the cell 1.

To determine the polarity of the voltages applied to cell electrodes, the voltage levels of the electrodes used during the reading step are used as a reference level. It is also possible to use the substrate's ground voltage as a reference voltage.

The invention makes it possible to use voltages below 10 Volts on the control gate and on the drain DF or drain DS. These voltages enable use of a cell power supply which is less costly and which has a lower power consumption, as described above. Such voltages allow a potential difference Vtun between 12 and 16 Volts to be maintained. These voltages therefore allow a potential difference Vtun substantially equal to those used in the state of the art to be maintained. The electric field generated between the floating gate and drain DF is thus substantially identical to the electric fields generated in the state of the art. The operation of the memory cell is therefore not altered by control gate and drain voltages lower than those used in the state of the art.

Tests have been conducted with the following parameters: |Vg|=7V, |Vd|=7V, |Vsg|=16V, |Vb|=7V and |Vs|=7V and pulses of 4 millisecond duration. It was observed that the life of the memory cell was not affected by the control method in accordance with the invention.

Figure 7:
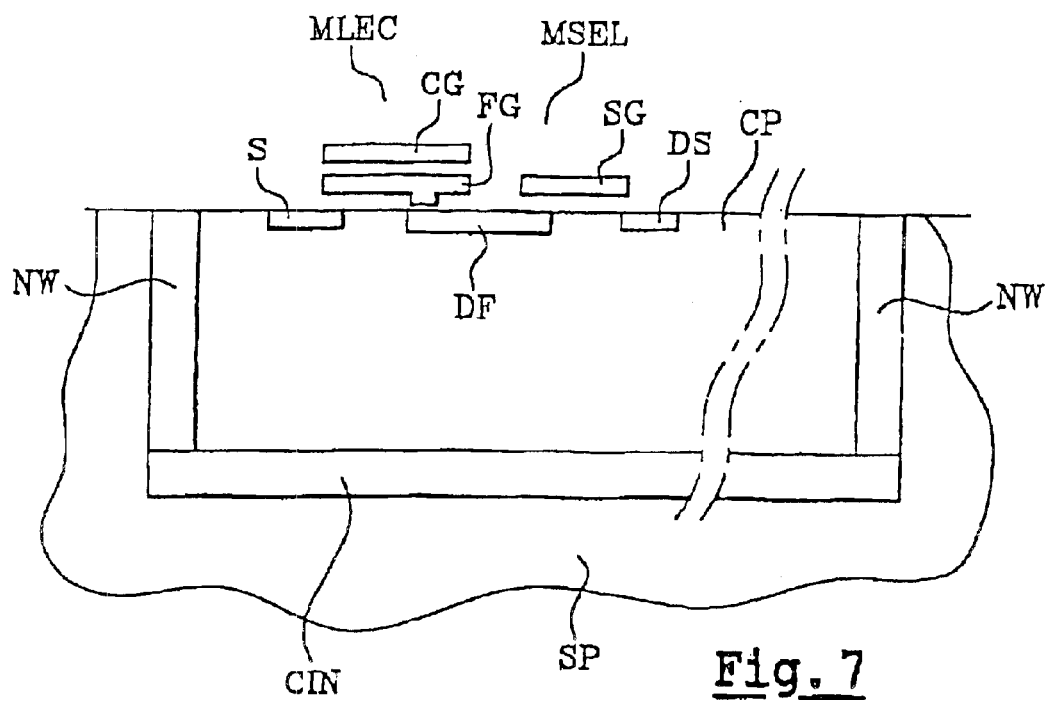
FIG. 7 is a cross-sectional diagram of a memory cell structure in accordance with the present invention.

The invention also relates to an electronic device comprising an EEPROM memory cell and a power supply for the memory cell. The device is configured to implement any one of the described methods in accordance with the invention. FIG. 7 shows schematically an example of a memory cell implementing the invention.

The memory cell comprises a selection transistor Msel, and a storage transistor Mlec. These transistors are produced in a P-type well identified by reference CP. Well zones forming isolation wells NW extend on the periphery of the well CP. The memory cell further comprises an N-type isolation well identified by reference CIN for connecting the wells NW.

Isolation well CIN isolates well CP from a P-type substrate identified by reference SP. Isolation well CIN enables voltages of opposite polarity to be applied to the control gate CG and to the drain DS or DF. The power supply of the different electrodes of the memory cell can be adapted to implement these method, as readily understood by those skilled in the art.

Although there has been described up to this point a memory cell provided with a floating gate transistor and a selection transistor, the invention is also applicable to a memory cell that does not have a selection transistor. Moreover, although the erasing and programming polarities described are associated respectively to erasing and programming, these polarities can be swapped.

That which is claimed is:

1. A method of controlling a memory cell in an EEPROM, the memory cell comprising a floating gate transistor comprising a first conducting terminal and a control gate, the method comprising:

setting a state of the memory cell by simultaneously applying voltage pulses of opposite polarities respectively to the first conducting terminal and to the control gate;

each of the voltage pulses including a first portion having a slope greater than K*8 megavolts/second and a second portion having a slope between K*1 kilovolts/second and K*1 megavolts/second, with K=1 when the voltage pulse has a positive polarity and with K=−1 when the voltage pulse has a negative polarity.

2. The method according to claim 1, wherein the first conducting terminal defines a drain of the floating gate transistor.

3. The method according to claim 1, where in each of the voltage pulses further includes a third portion having a substantially zero slope.

4. The method according to claim 3, wherein each of the voltage pulses further includes a fourth portion having a slope less than K*16 megavolts/second.

5. The method according to claim 1, wherein setting the state of the memory cell comprises a programming step; and wherein the voltage pulses applied to the control gate are negative and the voltage pulses applied to the first conducting terminal are positive.

6. The method according to claim 1, wherein setting the state of the memory cell comprises an erasing step; and wherein the voltage pulses applied to the control gate are positive and the voltage pulses applied to the first conducting terminal are negative.

7. The method according to claim 1, wherein the simultaneously applied voltage pulses have equal amplitudes.

8. The method according to claim 1, wherein the EEPROM comprises a substrate with the floating gate transistor formed therein; and further comprising applying to the substrate voltage pulses equal to those being applied to the first conducting terminal.

9. The method according to claim 8, wherein the polarities of the applied voltage pulses are defined relative to a reference voltage; and wherein the substrate is grounded for providing the reference voltage.

10. The method according to claim 1, wherein the applied voltage pulses each have an amplitude that is less than 10 volts.

11. The method according to claim 1, wherein the applied voltage pulses have a potential difference within a range of about 12 to 16 volts.

12. The method according to claim 1, wherein the memory cell further comprises a selection transistor comprising a first conducting terminal connected to the first conducting terminal of the floating gate transistor, and a gate; and further comprising applying voltage pulses of less than 12 volts to the gate of the selection transistor when setting the state of the memory cell.

13. The method according to claim 12, wherein the first conducting terminal of the selection transistor defines a source thereof.

14. The method according to claim 12, wherein the voltage pulses applied to the first conducting terminal of the selection transistor and to the first conducting terminal of the floating gate transistor have a same polarity.

15. The method of controlling a memory cell comprising a storage transistor, the storage transistor comprising a first conducting terminal and a control gate, the method comprising:

setting a state of the memory cell by simultaneously applying voltage pulses of opposite polarities respectively to the first conducting terminal and to the control gate;

each of the voltage pulses including a first portion having a slope greater than K*8 megavolts/second, a second portion having a slope between K*1 kilovolts/second and K*1 megavolts/second, a third portion having a substantially zero slope, and a fourth portion having a slope less than K*16 megavolts/second, with K=1 when the voltage pulse has a positive polarity and with K=−1 when the voltage pulse has a negative polarity.

16. The method according to claim 15, wherein the memory cell is within an EEPROM; and wherein the storage transistor comprises a floating gate transistor and the first conducting terminal forms a drain thereof.

17. The method according to claim 15, wherein setting the state of the memory cell comprises a programming step; and wherein the voltage pulses applied to the control gate are negative and the voltage pulses applied to the first conducting terminal are positive.

18. The method according to claim 15, wherein setting the state of the memory cell comprises an erasing step; and wherein the voltage pulses applied to the control gate are positive and the voltage pulses applied to the first conducting terminal are negative.

19. The method according to claim 15, wherein the simultaneously applied voltage pulses have equal amplitudes.

20. The method according to claim 15, wherein the applied voltage pulses have an amplitude that is less than 10 volts; and wherein the applied voltage pulses have a potential difference within a range of about 12 to 16 volts.

21. The method according to claim 15, wherein the memory cell further comprises a selection transistor comprising a first conducting terminal connected to the first conducting terminal of the floating gate transistor, and a gate; and further comprising applying voltage pulses of less than 12 volts to the gate of the selection transistor when setting the state of the memory cell.

22. The according to claim 21, wherein the voltage pulses applied to the first conducting terminal of the selection transistor and to the first conducting terminal of the floating gate transistor have a same polarity.

23. The electronic device comprising:

an EEPROM comprising a plurality of memory cells, each memory cell comprising a floating gate transistor comprising a first conducting terminal and a control gate; and at least one power supply for simultaneously applying voltage pulses of opposite polarities respectively to the first conducting terminal and to the control gate of a selected memory cell when setting a state thereof;

each of the voltage pulses including a first portion having a slope greater than K*8 megavolts/second and a second portion having a slope between K*1 kilovolts/second and K*1megavolts/second, with K=1 when the voltage pulse has a positive polarity and with K=−1 when the voltage pulse has a negative polarity.

24. The electronic device according to claim 23, wherein said EEPROM comprises a P-type substrate with said plurality of memory cells formed therein, said P-type substrate comprising a plurality of N-type isolation wells for isolating a plurality of P-type wells, each P-type well including a respective memory cell therein.

25. The electronic device according to claim 23, wherein the first conducting terminal defines a drain of said floating gate transistor.

26. The electronic device according to claim 23, wherein each of the voltage pulses further includes a third portion having a substantially zero slope, and a fourth portion having a slope less than K*16 megavolts/second.

27. The electronics device according to claim 23, wherein setting the state of the selected memory cell comprises a programming step; and wherein the voltage pulses applied to the control gate are negative and the voltage pulses applied to the first conducting terminal are positive.

28. The electronic device according to claim 23, wherein setting the state of the selected memory cell comprises an erasing step; and wherein the voltage pulses applied to the control gate are positive and the voltage pulses applied to the first conducting terminal are negative.

29. The electronic device according to claim 23, wherein the simultaneously applied voltage pulses have equal amplitudes.

30. The electronic device according to claim 24, wherein said at least one power supply cell also applies to said P-type substrate voltage pulses equal to those being applied to the first conducting terminal.

31. The electronic device according to claim 30, wherein the polarities of the applied voltage pulses are defined relative to a reference voltage; and wherein said substrate is grounded for providing the reference voltage.

32. The electronic device according to claim 23, wherein the applied voltage pulses each have an amplitude that is less than 10 volts.

33. The electronic device according to claim 23, wherein the applied voltage pulses have a potential difference within a range of about 12 to 16 volts.

34. The electronic device according to claim 23, wherein said EEPROM further comprises a plurality of selection transistors, each selection transistor comprising a first conducting terminal connected to the first conducting terminal of a respective floating gate transistor, and a gate; and wherein said at least one power supply cell also applies voltage pulses of less than 12 volts to the gate of said selection transistor when setting the state of the selected memory cell.

35. The electronic device according to claim 34, wherein the voltage pulses applied to the first conducting terminal of said selection transistor and to the first conducting terminal of said floating gate transistor have a same polarity.

* * * * *